United States Patent [19]

Fleischer

[11] 4,313,096
[45] Jan. 26, 1982

[54] PARASITIC-FREE SWITCHED CAPACITOR NETWORK

[75] Inventor: Paul E. Fleischer, Little Silver, N.J.

[73] Assignee: Bell Telephone Laboratories, Incorporated, Murray Hill, N.J.

[21] Appl. No.: 95,663

[22] Filed: Nov. 19, 1979

[51] Int. Cl.³ .......................................... H03H 19/00
[52] U.S. Cl. .................................. 333/173; 328/151; 333/19
[58] Field of Search ................. 333/173, 19, 20; 328/165, 167, 151; 307/240, 241, 295, 231, 510, 522, 523

[56] References Cited

PUBLICATIONS

Martin, "Improved Circuits for the Realization of Switched Capacitor Filters", Proc. of 1979 IEEE International Symposium on Circuits and Systems, 1979; pp. 756-759.
Martin et al., "Strays-Insensitive Switched Capacitor Filters Based on Bilinear Z-Transform", Electronics Letters, Jun. 21, 1979; pp. 365-366.
White et al., "A Monolithic Dual-Tone Multifrequency Receiver", Digest of Technical Papers: 1979 IEEE International Solid-State Circuits Conference, Feb. 1979; pp. 36-37.

Primary Examiner—Marvin L. Nussbaum
Attorney, Agent, or Firm—Sylvan Sherman; Volker R. Ulbrich

[57] ABSTRACT

Switched capacitor topologies currently in use are susceptible to the deleterious effects of the parasitic capacitances associated with the switches. Topologies that are immune to these effects are disclosed. A first such embodiment comprises a first switch (22, 32), a capacitor (23, 33), and a second switch (24, 34) connected in series between one input terminal (1) and one output terminal (3) of the network. Third and fourth switches (26, 35 and 27, 36) are connected between the junctions (98, 42 and 99, 43) of the capacitor and the first and second switches, respectively, and the common junction (97, 41) of the second input and second output terminals (2, 4). A second embodiment is also disclosed.

16 Claims, 10 Drawing Figures

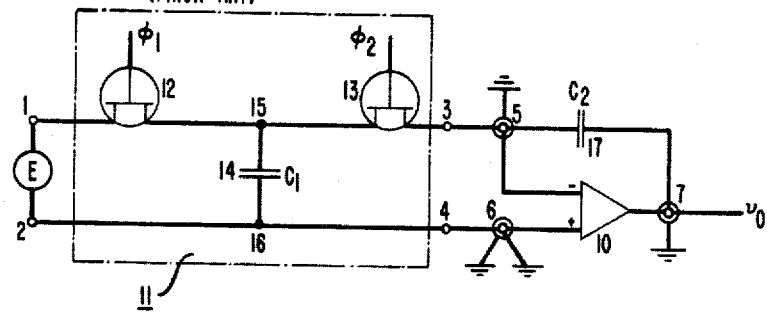
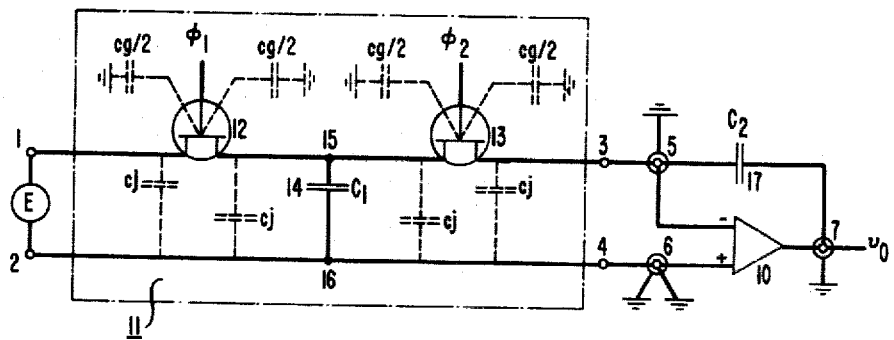
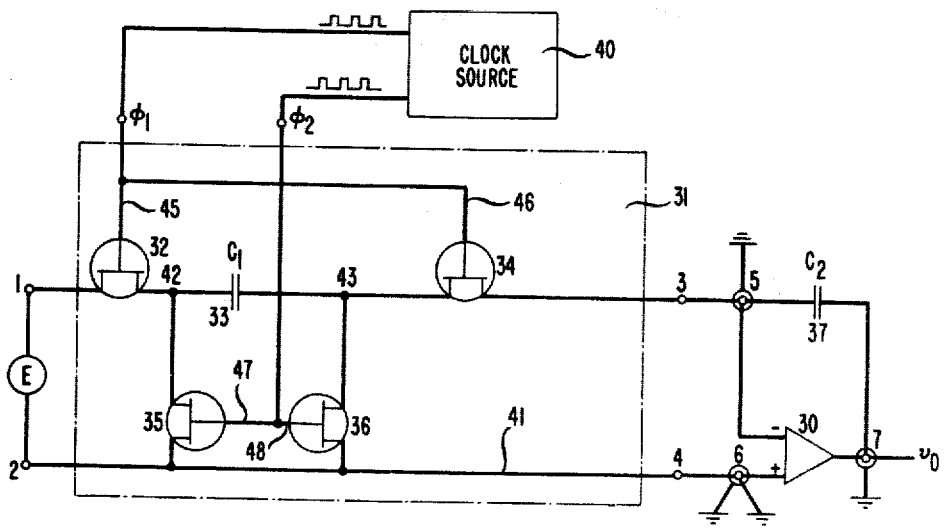

PARASITIC-FREE SWITCHED CAPACITOR NETWORK

TECHNICAL FIELD

This invention relates to switched capacitor circuits and, in particular, to arrangements for minimizing the effect of parasitic capacitances upon the operation of such circuits.

BACKGROUND OF THE INVENTION

Most switched capacitor filters currently proposed comprise an interconnected set of switched capacitor integrators. (See, for example, "MOS Sampled Data Recursive Filters Using Switched Capacitor Integrators" by B. J. Hosticka et al., published in the December, 1977 issue of the *IEEE Journal of Solid State Circuits*, Vol. SC-12, No. 6.). Such circuits, however, are susceptible to the effects of parasitic capacitances associated with the switching devices. The result is to cause inaccuracies in the overall filter transfer function. In addition, inasmuch as the switch parasitics are voltage dependent, they are also a source of harmonic distortion.

SUMMARY OF THE INVENTION

The present invention is embodied in two switched capacitor networks. When connected between a signal voltage source and a virtual ground, either circuit serves to minimize the effect any parasitic capacitances associated with the switches may have on the overall circuit performance.

In accordance with one embodiment of the invention, the network comprises a first switch, a capacitor, and a second switch connected in series between a first input terminal and a first output terminal of said network. Third and fourth switches are connected between the junctions of the capacitor and each of the first and second switches, respectively, and the common junction formed by the second input and the second output network terminals. In addition, the first and second switches are connected such that they operate to share a common closed period. Similarly, the third and fourth switches are connected together to share a common closed period.

When used as the input network of a switched capacitor integrator, a voltage signal source is connected to the network input terminals. The first and second network output terminals are connectd, respectively, to the inverting and noninverting input ports of an operational amplifier. To form a virtual ground at the inverting input port of the operational amplifier, the noninverting port is connected to signal ground, and a feedback capacitor is connected between the amplifier output port and the inverting input port.

Nonoverlapping clock means are provided for jointly opening and closing the first and second switches while jointly closing and opening the third and fourth switches.

In a second embodiment of the invention, a fifth switch is added in series with said second switch, and a second capacitor is added between the junction of said second and fifth swtiches and the common junction. In this second embodiment, parasitic-free operation is obtained by making the capacitances of the two network capacitors equal.

Switched capacitor networks of the type described can also be employed as the equivalent resistive element in a "leaky" integrator.

BRIEF DESCRIPTION OF THE DRAWINGS

FIG. 1 shows a prior art switched capacitor integrator;

FIG. 2 shows the integrator of FIG. 1 and the various parasitic capacitances associated with the several switches;

FIGS. 3 and 4 show two parasitic-free switched capacitor networks in accordance with the present invention.

DETAILED DESCRIPTION

Figure 4:
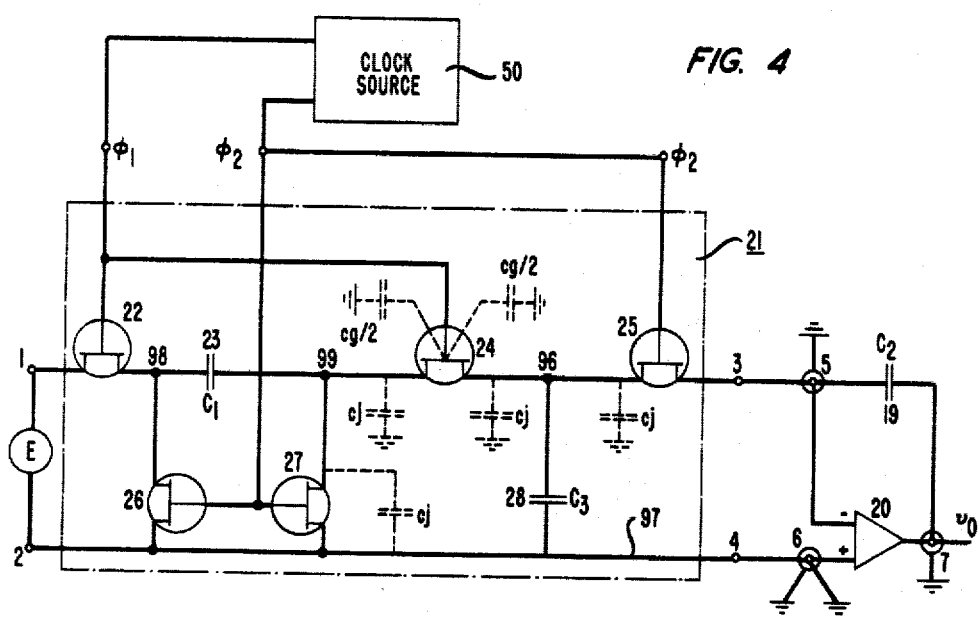

Referring to the drawings, FIG. 1 shows an integrator circuit including a prior art switched capacitor network 11. The latter, serving as the input network to an operational amplifier 10, comprises a pair of switches 12 and 13 connected in series between one of the network input terminals 1 and one of the network output terminals 3. For purposes of illustration, switches 12 and 13 are depicted as field effect transistors (FETs) whose source-drain paths are connected in series. A capacitor 14 is connected between the junction 15 of switches 12 and 13, and the common junction 16 of the second network input terminal 2 and output terminal 4.

Network input terminals 1 and 2 are connected to a signal voltage source E. Network output terminals 3 and 4 are connected, respectively, to the inverting input port 5 and the noninverting input port 6 of amplifier 10. To form an integrator having a virtual ground at port 5 of amplifier 10, port 6 is connected to signal ground, and a feedback capacitor 17 is connected between amplifier output port 7 and inverting input port 5. (The term "virtual ground" as used herein is used in its usual sense to refer to a circuit condition at a node into and out of which current may flow but at which the signal voltage remains substantially equal to zero).

In operation, timing signals $\phi_1$ and $\phi_2$, representing nonoverlapping pulse trains, are applied to the gate electrodes of switches 12 and 13 to alternately open and close the respective switches. Pulse trains $\phi_1$ and $\phi_2$ are considered to be nonoverlapping when the respective switches they control are never in the closed state simultaneously. They may, however, be in the opened state simultaneously. With switch 12 closed and switch 13 open, a charge Q is stored on capacitor 14 where $$Q = EC_1. \quad (1)$$

Switch 12 then opens and switch 13 closes, causing charge Q to be transferred onto capacitor 17. The resulting change in the output voltage $v_o$ thus produced is given by $$\Delta v_o = -E(C_1/C_2). \quad (2)$$

As can be seen, the change in the output voltage $v_o$ is a function of the ratio of capacitors $C_1$ and $C_2$. The effect of parasitic capacitances upon $\Delta v_o$ is now considered in connection with FIG. 2, which shows the integrator of FIG. 1 to which there have been added a number of parasitic capacitors shown in dashed line. These include drain and source junction capacitors $c_j$, and gate junction capacitors $c_g$ which are shown divided into two portions $c_g/2$.

With switch 12 closed and switch 13 open, all the junction capacitors associated with switch 12, along with capacitor $C_1$ and the junction capacitor $c_j$ on the input side of switch 13 are charged by source voltage E. When switch 12 opens and switch 13 closes, the total charge available for discharge into capacitor 17 includes that stored on capacitor 14, plus that stored in the junction capacitors shunting capacitor 14. This includes a portion (i.e., $\approx$ half) of the charge stored in $c_g$ of switch 12. (The balance of the charge stored in $c_g$ is effectively isolated from the rest of the circuit when switch 12 is opened). When 12 opens and 13 closes, all of this charge, $$Q = E(C_1 + 2c_j + c_g/2), \tag{3}$$

is transferred to capacitor $C_2$, producing a change in the output voltage given by $$\Delta v_o = -E(C_1 + 2c_j + c_g/2)/C_2. \tag{4}$$

None of the charge is stored on the parasitic capacitors of switch 13 because of the virtual ground at amplifier port 5, and the fact that switch 13 is essentially a short circuit when closed.

It will be noted from equation (4) that the change in the output voltage $v_o$ is no longer proportional to the simple ratio of $C_1$ to $C_2$, but is modified by the junction capacitances of the switches. These are not easily controlled and, in addition, are voltage dependent. Thus, the transfer function of the integrator is not readily predictable and, in addition, is nonlinear, resulting in harmonic distortion.

FIG. 3 shows a first embodiment of a switched capacitor network 31 in accordance with the present invention. The network includes a first switch 32, a capacitor 33, and a second switch 34 connected in series between a first network input terminal 1 and a first network output terminal 3. A third switch is connected between the junction 42 of switch 32 and capacitor 33, and the common junction 41 of the second network input terminal 2 and the second network output terminal 4. A fourth switch 36 is connected between the junction 43 of capacitor 33 and the second switch 34, and said common junction.

For purposes of explanation, the network input terminals 1, 2 are connected to a signal voltage source E, and the network output terminals 3 and 4 are connected, respectively, to the inverting input port 5 and the noninverting input port 6 of an operational amplifier 30. To form a virtual ground at port 5, port 6 is connected to signal ground, and a feedback capacitor 37 is connected between amplifier output port 7 and inverting input port 5.

A drive source 40 provides a pair of nonoverlapping pulse trains $\phi_1$ and $\phi_2$ for closing and opening the several switches. In particular, pulse train $\phi_1$ is coupled to gate electrodes 45 and 46, respectively, of switches 32 and 34, while pulse train $\phi_2$ is coupled to gate electrodes 47 and 48, respectively, of switches 35 and 36.

In operation, with switches 35 and 36 closed, and switches 32 and 34 opened, capacitor 33 and all parasitic capacitors connected thereto are discharged. Since switch 34 is open, any charge stored in capacitor 37 is unaffected.

During the following phase of operation switches 35 and 36 are open and switches 32 and 34 are closed, charging capacitor 33. Because port 5 is at virtual ground, the entire input voltage E is impressed across capacitor 33 and a charge $Q_1$, equal to $$Q_1 = EC_1, \tag{5}$$

is stored thereon. An equal increment of charge is also stored on capacitor $C_2$ to produce a change in the output voltage $v_o$ given by $$\Delta v_o = -(Q_1/C_2) = -E(C_1/C_2). \tag{6}$$

It will be noted that because of the virtual ground at port 5, none of the parasitic junction capacitors associated with switches 36 and 34 is charged during this phase and, hence, there is no contribution by any of these parasitics to the output voltage. It will be noted that while parasitic capacitances in the input side of capacitor 33 are charged to the input voltage during this phase of operation, they are discharged to signal ground during the following phase and do not contribute to any change in the output voltage. The circuit is, in effect, parasitic-free.

FIG. 4, now to be considered, shows a switched capacitor network 21 in accordance with a second embodiment of the invention. The network includes a first switch 22, a first capacitor 23, a second switch 24, and a third switch 25, connected in series between a first network input terminal 1 and a first network output terminal 3. Fourth and fifth switches 26 and 27 are connected between the junctions 98, 99 of capacitor 23 and switches 22 and 24, respectively, and the common junction 97 of the second network input terminal 2 and the second network output terminal 4. A second capacitor 28 is connected between the junction 96 of switches 24 and 25 and said common junction 97.

For purposes of explanation, network 21 is also incorporated into an integrator circuit where, as in the embodiment of FIG. 3, input terminals 1 and 2 are connected to a signal voltage source E, and network output terminals 3 and 4 are connected, respectively, to the inverting input port 5 and the noninverting input port 6 of an operational amplifier 20. A feedback capacitor 19 is connected between amplifier output port 7 and input port 5, and input port 6 is connected to signal ground, thus forming a virtual ground at port 5. Associated with each of the switches are the junction capacitances as illustrated in FIG. 2.

During a first phase of operation, switches 22 and 24 are closed by a signal associated with a first pulse train $\phi_1$, while switches 25, 26 and 27 are opened by a second signal associated with a second, nonoverlapping pulse train $\phi_2$. Both pulse trains are derived from a clock source 50. In this state, capacitors 23 and 28 are charged by signal source E as are the junction capacitors associated with the several switches. Of particular interest are the parasitic capacitors in parallel with capacitor 28 shown in dashed line in FIG. 4. Because of their presence, the voltage e at junction 96 is $$e = E \frac{C_1}{C_1 + C_3 + 4c_j + c_g} \tag{7}$$

The charge stored in capacitor 28 and in each of the parasitic capacitors is, respectively.

$$Q_3 = eC_3 = E \frac{C_1 C_3}{C_1 + C_3 + 4c_j + c_g} \quad (8)$$

$$Q_j = ec_j = E \frac{C_1 c_j}{C_1 + C_3 + 4c_j + c_g} \quad (9)$$

and $$Q_g = ec_g = E \frac{C_1 c_g}{C_1 + C_3 + 4c_j + c_g} \quad (10)$$

During the next phase of operation, switches 22 and 24 are opened and switches 25, 26 and 27 are subsequently closed. With the closing of switch 25, a portion of the stored charge is transferred to capacitor 19. It will be noted that with the opening of switch 24, the charge stored on the parasitic capacitors on the source side (i.e., to the left) of switch 24 are discharged to ground by way of switch 27. This includes two junction capacitors $c_j$ and a portion (i.e. $\approx$ one-half) of the capacitance associated with the gate, i.e., $c_g/2$. Thus, the total charge $Q_T$ discharged into capacitor 19 is the charge stored on the output side (i.e., to the right) of switch 24 given by $$Q_T = Q_3 + 2Q_j + Q_g/2 \quad (11)$$

Substituting in (11) for the respective charges from equations (8), (9) and (10), we obtain $$Q_T = \frac{EC_1(C_3 + 2c_j + c_g/2)}{(C_1 + C_3 + 4c_j + c_g)} \quad (12)$$

If, in addition, $C_1 = C_3$, equation (12) reduces to $$Q_T = EC_1/2 \quad (13)$$

and the change in output voltage $v_o$ is $$\Delta v_o = -\frac{E}{2} \frac{C_1}{C_2} \quad (14)$$

Thus, for the case of $C_1 = C_3$, the circuit of FIG. 4 is free of the effects of parasitic switch capacitances. However, it will also be noted that the change in the output voltage is reduced by one-half, as compared with the circuit of FIG. 1 or FIG. 3 for the same capacitor ratios.

While the embodiment of FIG. 3 is simpler than the embodiment of FIG. 4 (i.e., has one less switch and one less capacitor), each circuit has its separate unique use. It will be noted that in the embodiment of FIG. 4, capacitor $C_3$ is charged during phase $\phi_1$. This is followed by a discharge of capacitor $C_3$ and the charging of capacitor $C_2$ during the next phase $\phi_2$. By contrast, in the embodiment of FIG. 3, capacitor $C_2$ is charged directly from source E during phase $\phi_1$. Thus, each of the two embodiments has a different delay associated with it and can be used as a parasitic-free switched capacitor replacement network, depending upon the mode of operation desired.

Figure 5:
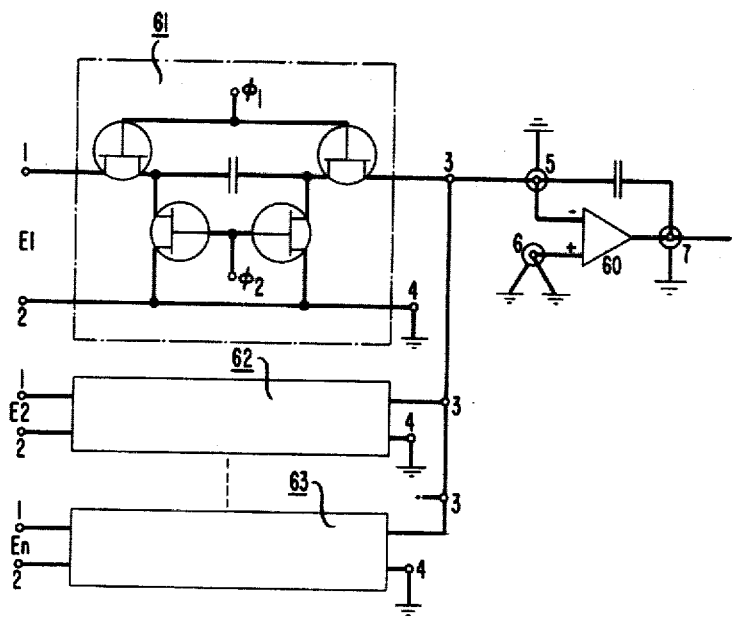
FIGS. 5, 6, 7, 8, 9 and 10 illustrate several applications of the parasitic-free switched capacitor network of FIG. 3.
Figure 6:
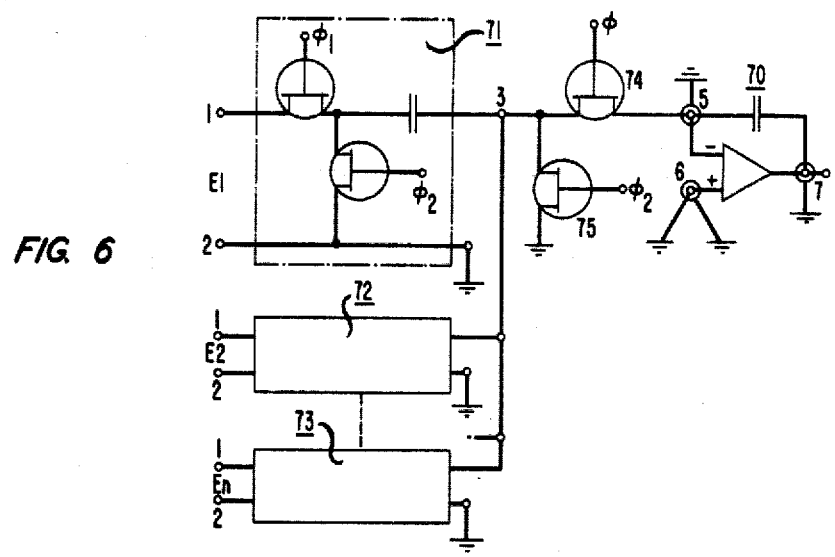

FIGS. 5, 6, 7, 8, 9 and 10 illustrate several applications of the parasitic-free switched capacitor networks shown in FIGS. 3 and 4. Of these, FIG. 5 illustrates a circuit arrangement for integrating multiple signal inputs $E_1, E_2 \ldots E_n$ comprising a plurality of n input networks 61, 62 ... 63 of the type shown, for example in FIG. 3, coupled to the inverting input port 5 of amplifier 60. Noting the commonality of certain switches operating in parallel, the circuit of FIG. 5 can be modified, as illustrated in FIG. 6, wherein each of the input networks 71, 72 ... 73 share switches 74 and 75 in common.

Figure 7:
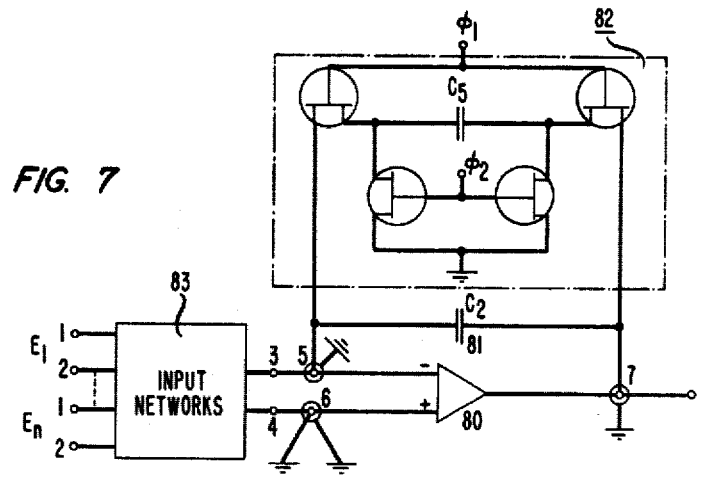

FIG. 7 illustrates the use of a parasitic-free switched capacitor network acting, in effect, as a resistor in a so-called "leaky" integrator. In this configuration, switch capacitor network 82 is connected in parallel with feedback capacitor 81 connected between output port 7 and the inverting input port 5 of amplifier 80. One or more input signals $E_1 \ldots E_n$ are coupled to amplifier 80 by means of input networks 83 of the type shown in FIG. 3. It will be noted that the arrangement of FIG. 7 is the same as that shown in FIG. 5 wherein one of the voltage sources, $E_i$, is derived from the amplifier output port 7.

Figure 8:
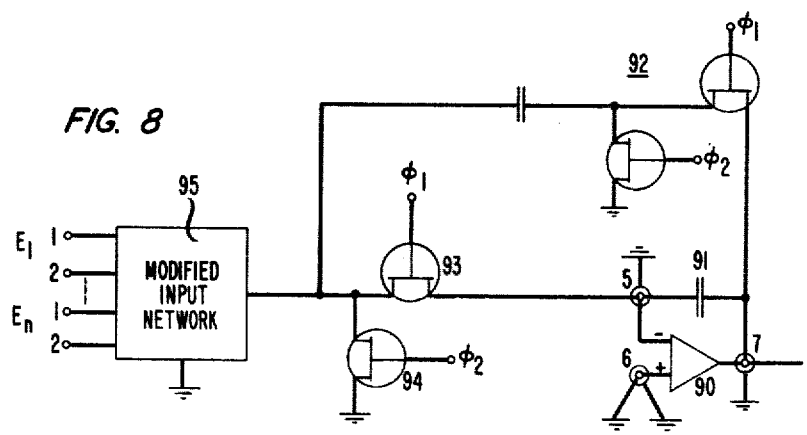

FIG. 8 shows the embodiment of FIG. 7 modified such that the input networks 95 and the feedback network 92 share switches 93 and 94, in common, as explained in connection with FIG. 6.

Figure 9:
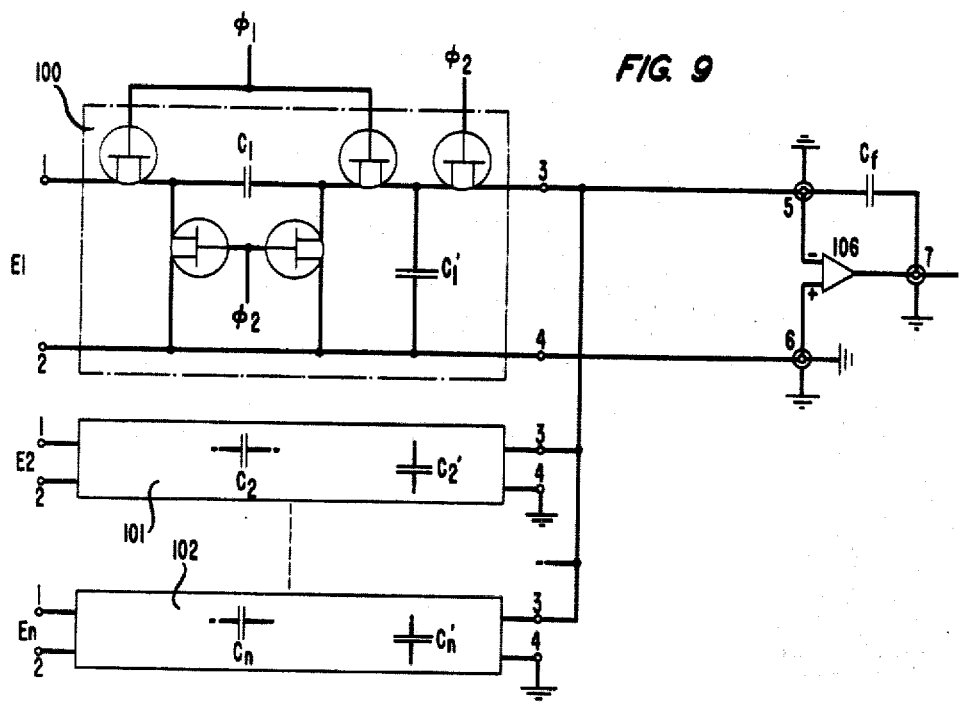

FIG. 9 illustrates the use of a plurality of switched capacitor networks of the type shown in FIG. 4 for integrating an equal plurality of input signals $E_1, E_2 \ldots E_n$. Without sharing components in common among the networks, parasitic-free operation is obtained, as before, when the capacitance of the first capacitor in each of the networks is equal to the capacitance of the second capacitor in the respective networks. That is $$C_1 = C_1'; C_2 = C_2' \ldots C_n = C_n'. \quad (15)$$

The change in output voltage is simply the sum of the changes caused by each source and is given by $$\Delta v_o = -\frac{1}{2}\left(\frac{C_1}{C_f} E_1 + \frac{C_2}{C_f} E_2 + \ldots \frac{C_n}{C_f} E_n\right), \quad (16)$$

where $C_f$ is the amplifier 103 feedback capacitor.

Figure 10:
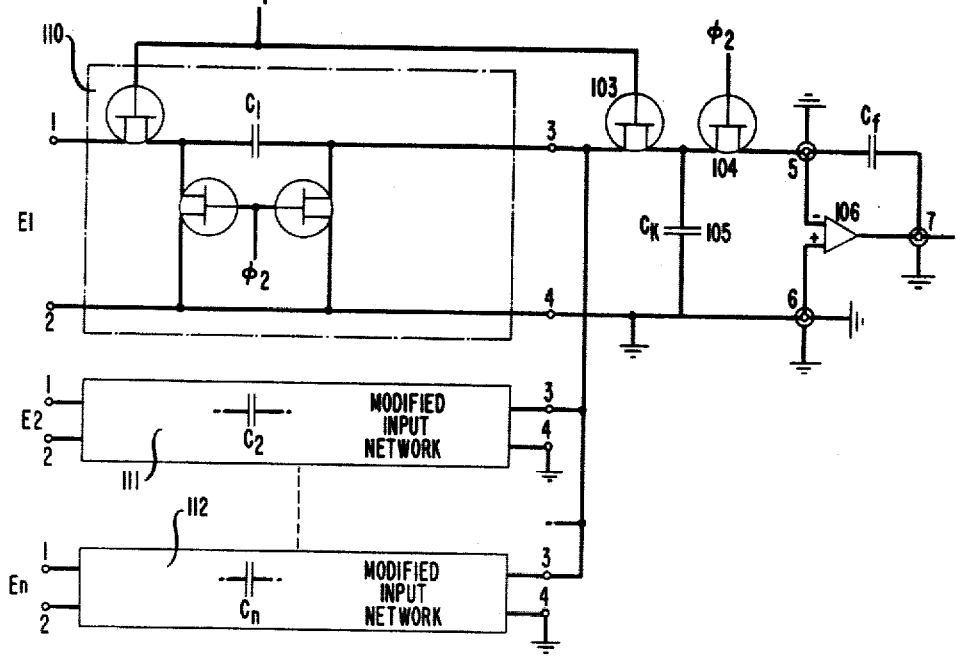

FIG. 10 shows a modified arrangement of FIG. 9 wherein what was hereto referred to as the second and fifth switches and the second capacitor of each input network are shared in common by all the networks. In particular, in the embodiment of FIG. 10, switch 103, capacitor 104 and switch 105 are shared in common by the modified input networks 110, 111 ... 112. In this arrangement, parasitic-free operation is obtained when the capacitance $C_K$ of the common capacitor 105 is given by $$C_K = C_1 + C_2 \ldots + C_n \quad (17)$$

The change in the output voltage for this condition is then $$\Delta v_o = -\frac{E_1 C_1 + E_2 C_2 + \ldots E_n C_n}{2C_f} \quad (18)$$

As noted hereinabove, one of the input signals, $E_i$, can be derived from the output of amplifier 106.

In all of the above, $\phi_1\ \phi_2$ represent nonoverlapping pulse trains for operating the FET switches.

I claim:

1. A switched capacitor network having a pair of input terminals (1, 2) and a pair of output terminals (3, 4) comprising:

a first switch (22, 32), a capacitor (23, 33), and a second switch (24, 34) coupled in series between one input terminal (1) and one output terminal (3) of said network;

a third switch (26, 35) connected between the junction (98, 42) of said first switch (22, 32) and said capacitor (23, 33), and the common junction (97, 41) of the second input terminal (2) and the second output terminal (4);

a fourth switch (27, 36) connected between the junction (99, 43) of said capacitor (23, 33) and said second switch (24, 34), and said common junction (97, 41);

said first and second switches (22, 32 and 24, 34) being connected so as to be in the closed state over a common period; and said third and fourth switches (26, 35 and 27, 36) being connected so as to be in the closed state over a common period.

2. The network according to claim 1 including:

a fifth switch (25) connected in series between said second switch (24) and terminal (3); and a second capacitor (28) connected between the junction (96) of said second and fifth switches (24, 25), and said common junction (97).

3. The network according to claim 1 or claim 2 wherein:

a signal voltage source (E) is connected between said input terminals (1, 2);

said one output terminal (3) is connected to a virtual ground; and said second output terminal (4) is connected to signal ground.

4. The network according to claim 2 wherein the capacitance $C_1$ of said first capacitor (23) is equal to the capacitance $C_3$ of said second capacitor (28).

5. An integrator including a network according to claim 1 or 2 wherein:

said one output terminal (3) is coupled to the inverting input port (5) of an operational amplifier (30, 20);

said second output terminal (4) is coupled to the noninverting input port (6) of said amplifier;

a feedback capacitor (37, 19) is connected between the output port (7) of said amplifier and said inverting input port (5); and said noninverting input port (6) is connected to signal ground.

6. The network according to claim 1 or 2 wherein said switches are field effect transistors.

7. The network according to claim 1 including:

means (50, 40) for opening and closing said first and second switches (22, 24 and 32, 34); and for closing and opening said third and fourth switches (26, 27 and 35, 36).

8. The network according to claim 7 wherein said switches are field effect transistors; and wherein said means (50, 40) is a source of nonoverlapping pulse trains ($\phi_1$ and $\phi_2$) coupled to the gate electrodes of said first and second switches (22, 24 and 32, 34), and said third and fourth switches (26, 27 and 35, 36), respectively.

9. The network according to claim 2 including:

means (50) for opening and closing said first and second switches (22, 24); and for closing and opening said third, fourth and fifth switches (26, 27, 25).

10. The network according to claim 9 wherein said switches are field effect transistors; and wherein said means (50) is a source of nonoverlapping pulse trains ($\phi_1$ and $\phi_2$) coupled to the gate electrodes of said first and second switches (22, 24), and said third, fourth and fifth switches (26, 27, 25), respectively.

11. An integrator circuit comprising:

an operational amplifier (60) having an output port (7), an inverting port (5) and a noninverting input port (6);

means for forming a virtual ground at said inverting input port (5); and means, comprising a plurality of networks in accordance with claim 1, for coupling an equal plurality of voltage sources $E_1, E_2, \ldots E_n$ to said amplifier (60).

12. The integrator according to claim 11 wherein a pair of switches (93, 94) are shared in common as the second and fourth switches of each of said networks.

13. The integrator according to claims 11 or 12 wherein one of said voltage sources, $E_i$, is derived from the output port (7) of said amplifier (80).

14. An integrator circuit comprising:

an operational amplifier (106) having an output port (7), an inverting input port (5) and a noninverting input port (6);

means for forming a virtual ground at said inverting port (5); and means, comprising a plurality of networks in accordance with claim 2, for coupling an equal plurality of voltage sources $E_1, E_2 \ldots E_n$ to said amplifier (106).

15. The integrator according to claim 14 wherein a pair of switches (103, 104) and a capacitor (105) are shared in common as the second and fifth switches and the second capacitor of said networks.

16. The integrator according to claims 14 or 15 wherein one of said voltage, $E_i$, is derived from the output port (7) of said amplifier (80).

* * * * *